(12) United States Patent
Lvovsky

(10) Patent No.: US 7,576,542 B1
(45) Date of Patent: Aug. 18, 2009

(54) SYSTEM AND APPARATUS FOR PROVIDING ELECTRICAL AND COOLING INTERCONNECTIONS IN A MAGNETIC RESONANCE IMAGING (MRI) SYSTEM

(75) Inventor: Yuri Lvovsky, Florence, SC (US)

(73) Assignee: General Electric Co., Schenectady, NY (US)

( * ) Notice: Subject to any disclaimer, the term of this patent is extended or adjusted under 35 U.S.C. 154(b) by 0 days.

(21) Appl. No.: 12/146,596

(22) Filed: Jun. 26, 2008

(51) Int. Cl.
*G01V 3/00* (2006.01)
(52) U.S. Cl. ........................................ 324/318; 324/322
(58) Field of Classification Search ......... 324/300–322; 600/407–445; 333/219; 355/209
See application file for complete search history.

(56) References Cited

U.S. PATENT DOCUMENTS

| | | | | |
|---|---|---|---|---|
| 5,619,996 | A * | 4/1997 | Beresten | 600/422 |
| 6,011,394 | A * | 1/2000 | Petropoulos et al. | 324/318 |
| 6,618,610 | B2 * | 9/2003 | Nabetani | 600/422 |
| 6,930,482 | B2 | 8/2005 | Heid et al. | |
| 7,098,661 | B2 | 8/2006 | Nistler et al. | |
| 7,109,712 | B2 * | 9/2006 | Boskamp | 324/318 |
| 7,109,715 | B2 | 9/2006 | Heid et al. | |
| 7,173,422 | B2 | 2/2007 | Nistler et al. | |
| 7,239,141 | B2 | 7/2007 | Nistler et al. | |
| 7,295,012 | B1 * | 11/2007 | Lvovsky | 324/320 |
| 7,414,401 | B1 * | 8/2008 | Lvovsky | 324/318 |
| 7,489,131 | B2 * | 2/2009 | Lvovsky | 324/307 |
| 7,498,810 | B2 * | 3/2009 | Lvovsky et al. | 324/318 |
| 2007/0146107 | A1 * | 6/2007 | Lvovsky et al. | 335/296 |
| 2008/0259560 | A1 * | 10/2008 | Lvovsky | 361/689 |

\* cited by examiner

*Primary Examiner*—Brij B Shrivastav

(57) ABSTRACT

A coil assembly and a magnetic resonance imaging system employing same are disclosed. The coil assembly includes a main gradient coil assembly having a first section positioned at a first end of the MRI system distal to a patient support system and a second section positioned at a second end of the MRI system proximate to the patient support system. A first RF shield is disposed around at least a portion of the first section of the main gradient coil assembly. A second RF shield is disposed around at least a portion of the second section of the main gradient coil assembly. An aperture extends between the first section and the second section of the main gradient coil assembly and a conduit extends across the aperture. The conduit includes a first end coupled to the first RF shield and a second end coupled to the second RF shield. A hydraulic or electrical connection is disposed within and extends through the conduit. The conduit may also be an antenna element.

16 Claims, 7 Drawing Sheets

SYSTEM AND APPARATUS FOR PROVIDING ELECTRICAL AND COOLING INTERCONNECTIONS IN A MAGNETIC RESONANCE IMAGING (MRI) SYSTEM

FIELD OF THE DISCLOSURE

This disclosure relates generally to magnetic resonance imaging (MRI) systems, and in particular to a system and method for realizing cooling and electrical interconnections and mechanical support.

BACKGROUND

Magnetic resonance imaging (MRI) is a medical imaging modality that can create images of the inside of a human body without using X-rays or other ionizing radiation. MRI uses a powerful magnet to create a strong, uniform, static magnetic field (i.e., the "main magnetic field"). When a human body, or part of a human body, is placed in the main magnetic field, the nuclear spins that are associated with the hydrogen nuclei in tissue water become polarized. This means that the magnetic moments that are associated with these spins become preferentially aligned along the direction of the main magnetic field, resulting in a small net tissue magnetization along that axis (the "z-axis," by convention). A MRI system also comprises components called gradient coils that produce smaller amplitude, spatially varying magnetic fields when current is applied to them. Typically, gradient coils are designed to produce a magnetic field component that is aligned along the z axis (i.e., the "longitudinal axis"), and that varies linearly in amplitude with position along one of the x, y, or z axes. The effect of a gradient coil is to create a small ramp on the magnetic field strength, and concomitantly on the resonance frequency of the nuclear spins, along a single axis. Three gradient coils with orthogonal axes are used to "spatially encode" the MR signal by creating a signature resonance frequency at each location in the body. Radio frequency (RF) coils are used to create pulses of RF energy at or near the resonance frequency of the hydrogen nuclei. These coils are used to add energy to the nuclear spin system in a controlled fashion. As the nuclear spins then relax back to their rest energy state, they give up energy in the form of an RF signal. This signal is detected by the MRI system and is transformed into an image using a computer and known reconstruction algorithms.

One type of magnet assembly for an MRI system is cylindrical and annular in shape and includes, among other elements, a superconducting magnet, a gradient coil assembly and an RF body coil assembly. The RF body coil assembly can be mounted on the outside of a patient bore tube and mounted inside the gradient coil assembly. The gradient coil assembly is disposed around the RF body coil assembly in a spaced-apart coaxial relationship and the gradient coil assembly circumferentially surrounds the RF body coil assembly. The gradient coil assembly is mounted inside the superconducting magnet and circumferentially surrounded by the superconducting magnet. Interconnections for supply and return of electricity, control signals, coolant and the like are typically routed from a "service end" of the MRI scanner around the cylindrical magnet assembly, while a patient table and other patient-directed aspects are placed at another end, the "patient end," of the MRI scanner.

The gradient coil assembly used in an MRI system may be a shielded gradient coil assembly that consists of inner and outer gradient coil assemblies bonded together with a material such as epoxy resin. The inner gradient coil assembly or winding and the outer gradient coil assembly or winding are disposed in concentric arrangement with respect to a common axis. Typically, the inner gradient coil assembly includes inner (or main) X-, Y- and Z-gradient coils and the outer gradient coil assembly includes the respective outer (or shielding) X-, Y- and Z-gradient coils. In order to improve gradient coil performance as well as to reduce the radial space used in the magnet assembly, combined (or integrated) gradient coil/RF coil designs have been developed (for example, as described in U.S. Pat. No. 6,930,482, entitled "Time-Variable Magnetic Fields Generator For A Magnetic Resonance Apparatus," issued on Aug. 16, 2005, naming Oliver Heid and Markus Vester as inventors). Such designs allow the main gradient coils to be brought closer radially to the imaging region, which can improve gradient performance. In an integrated gradient coil/RF coil configuration, a main (or inner) gradient coil assembly and RF coil are combined into a single unit by splitting the main gradient coil (i.e., the X, Y- and Z-main gradient coils of the main (or inner) gradient coil assembly) into two portions thereby creating a gap along the length of the cylindrical main gradient coil. An RF resonator (e.g., an RF coil) is positioned in the gap between the two portions of the main gradient coil. A birdcage type RF coil can be created by bridging the gap with rungs spanned by capacitors.

For a combined (or integrated) gradient coil/RF coil configuration, each portion of the split main gradient coil (X, Y and Z main coils) requires electrical connections (or leads). In addition, cooling lines have to be connected to and routed through the gradient coil/RF coil assembly. The coolant and lead connections are complicated by the need to deliver coolant and current to each of the separate portions of the main X, Y and Z gradient coils. Accordingly, there is a need for robust electrical and hydraulic connections for the each portion of the split main gradient coil that maintain or improve performance limits.

BRIEF DESCRIPTION

The above-mentioned shortcomings, disadvantages and problems are addressed herein, which will be understood by reading and studying the following disclosure.

In accordance with an embodiment, a coil assembly for a magnetic resonance imaging (MRI) system includes a main gradient coil assembly comprising a first section positioned at a first end of the MRI system distal to a patient support system and a second section positioned at a second end of the MRI system proximate to the patient support system, a first RF shield disposed around at least a portion of the first section of the main gradient coil assembly, a second RF shield disposed around at least a portion of the second section of the main gradient coil assembly, an aperture extending between the first section and the second section of the main gradient coil assembly, a conduit extending across the aperture and comprising a first end coupled to the first RF shield and a second end coupled to the second RF shield, and a hydraulic connection disposed within and extending through the conduit.

In accordance with another embodiment, a coil assembly for a magnetic resonance imaging (MRI) system includes a main gradient coil assembly comprising a first section positioned at a first end of the MRI system distal to a patient support system and a second section positioned at a second end of the MRI system proximate to the patient support system, a first RF shield disposed around at least a portion of the first section of the main gradient coil assembly, a second RF shield disposed around at least a portion of the second section of the main gradient coil assembly, an aperture extending between the first section and the second section of the main gradient coil assembly, a conduit extending across the aperture and comprising a first end coupled to the first RF shield and a second end coupled to the second RF shield, and an electrical connection disposed within and extending through the conduit.

Systems and apparatus of varying scope are described herein. In addition to the aspects described in this summary, further aspects will become apparent by reference to the drawings and by reading the following detailed description.

DETAILED DESCRIPTION

In the following detailed description, reference is made to the accompanying drawings forming a part hereof, and in which are shown, by way of illustration, specific embodiments that may be practiced. These embodiments are described in sufficient detail to enable those skilled in the art to practice the embodiments, and it is to be understood that other embodiments may be utilized, and that logical, mechanical, electrical and other changes may be made, without departing from the scope of the embodiments.

None of the FIGs. are drawn to scale. Ranges of parameter values described herein are understood to include all subranges falling therewithin. The following detailed description is, therefore, not to be taken in a limiting sense. As used herein, the term "capacitor" is used to include discrete circuit components as well as physical portions of conductors manifesting a capacitance between them.

Figure 1:
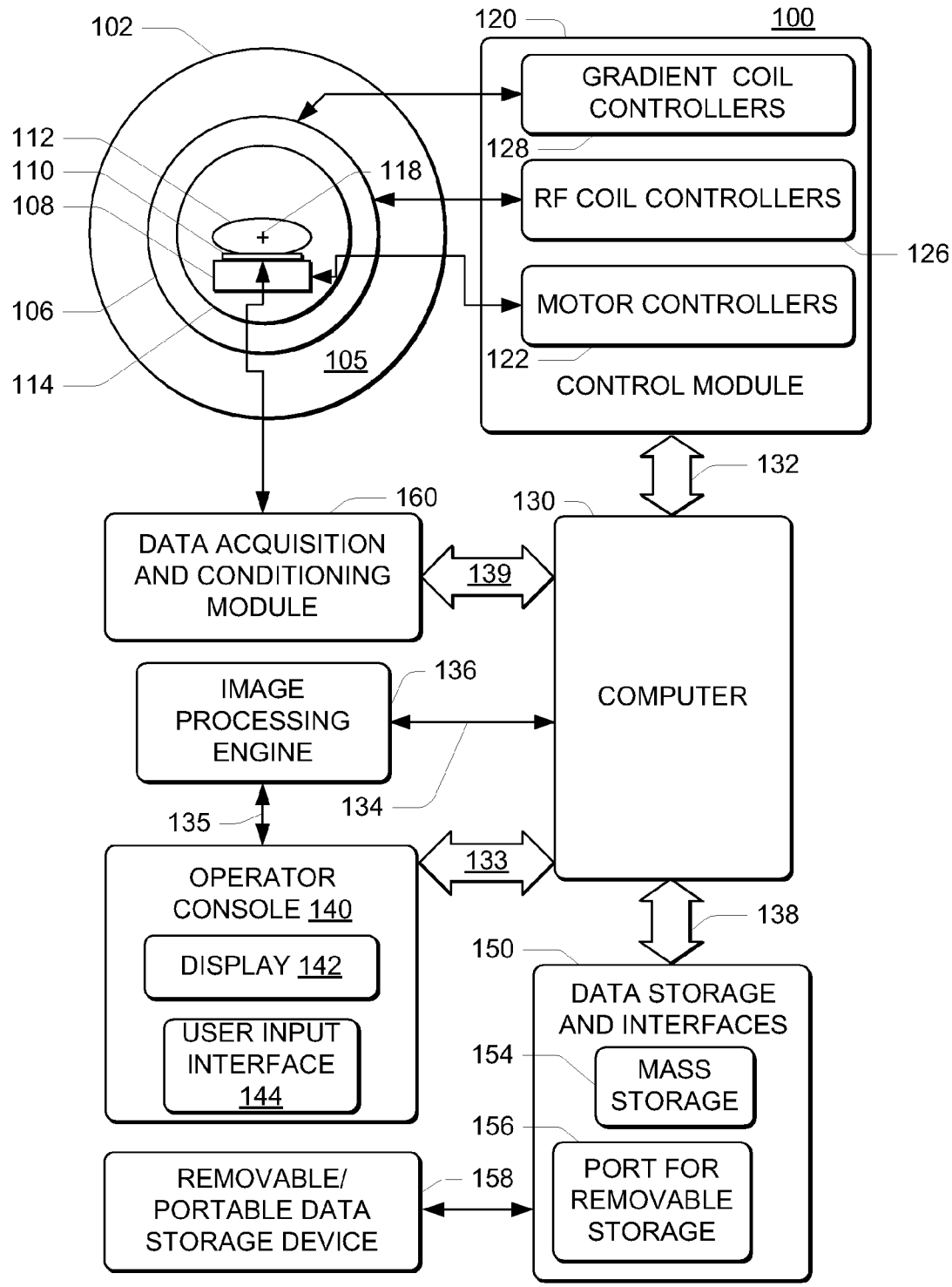
FIG. 1 is simplified block diagram of a magnetic resonance imaging (MRI) system including a resonance assembly in accordance with an embodiment.

FIG. 1 is simplified block diagram of an MRI system including a resonance module in accordance with an embodiment. Resonance module 102 is cylindrical in cross-section and includes a main magnet 105. The main magnet 105 is annular in cross-section and surrounds a gradient coil and RF body coil assembly 106. MRI system 100 also includes associated conventional elements that are not illustrated in FIG. 1, for simplicity of illustration and to promote ease of interpretation. MRI system 100 also includes a motorized test subject support (or patient support system) 108 secured in suitable working relationship vis-a-vis the main magnet 105 and which is suitable for usage in the MRI system 100. The main magnet 105 may include, among other elements, superconducting main coils and shielding coils. As discussed further below, the gradient coil and RF body coil assembly 106 are formed as an integrated gradient coil/RF body coil configuration.

An exemplary optional RF receiver coil 110, such as a surface or parallel RF coil adapted to the imaging task at hand, may be appropriately positioned relative to a test subject 112, or patient, to be imaged. A patient bore 114 sufficient to accommodate a combination of the test subject 112, the RF receiver coil 110, and the test subject support 108 is situated to allow the combination to be linearly translated along an axis 118 at a center of the bore 114 and extending at right angles to the page of the illustration, that is, into and out of the plane of FIG. 1, within the patient bore 114.

Components of the MRI system 100, such as the resonance module 102, the RF receiver coil 110 and the test subject 112, are maintained in appropriate and predetermined defined geometric relationship to one another. Geometric arrangement of the components may be varied and controlled, depending on the type of examination sought and the nature of imaging desired.

In one embodiment, the RF receiver coil 110 comprises an optional floating receptor, that is, a RF receiver coil 110 that is not fixedly attached to the main magnet 105 or the gradient and RF coil assemblies 106 and that is not physically or fixedly coupled to or associated with the patient support system 108. In other words, the floating RF receiver coil 110 is portable and is hence 'floating' with respect to other elements of the MRI system 100, and it is attached to the rest of the MRI system 100 via a tether which also serves to communicate electronic signals to other portions of the MRI system 100, as is described in more detail below.

The MRI system 100 also optionally includes a control module or controller 120. The controller 120 may include a motor control module 122 configured to cause computer-controlled motion of the test subject support 108 and thus the test subject 112 relative to the resonance module 102 and the magnet 105 along the axis 118, for example.

The controller 120 may also include RF body coil controllers 126 and/or gradient coil controllers 128 configured to control RF signals and gradients, respectively, manifested within the bore 114, as is known in the relevant arts, and to facilitate data transfer therefrom. The RF body coil controller 126 switches an RF body coil component of the gradient and RF body coil assemblies 106 between a transmit mode and a receive mode and controls signals received by the RF body coil or the optional RF receiver coil 110 to the rest of the MRI system 100, responsive to operator control.

One or more computers 130 provide connections to the controller 120 via a bus 132 configured for receiving data descriptive of operating conditions and configurations and for supplying appropriate control signals. Buses 133, 134 and 135 act to transfer data and control signals, for example, with respect to a module 136. The module 136 is configured as an image processing engine and may comprise software coupled with a computation resource, hardware such as application-specific integrated circuitry, or a combination thereof, and is coupled to the MRI system 100 via interconnections such as 134, 135 that are configured for exchange of signals and data to and/or from the computer 130, as well as other elements of the MRI system 100 and/or external computation or communications resources.

The system 100 also includes a bus 138, a bus 139 and an operator console 140. The operator console 140 is coupled to the MRI system 100 through the bus 133. The operator console 140 includes one or more displays 142 and a user input interface 144. The user input interface 144 may include media, such as one or more of a keyboard, a mouse or other tactile input device, capability for voice commands and/or other input devices. The one or more displays 142 provide video, symbolic and/or audio information relative to operation of MRI system 100, user-selectable options and images descriptive of the test subject 112, and may display a graphical user interface for facilitating user selection among various modes of operation and other system settings.

The image processing engine 136 facilitates automation of accurate measurement and assessment. The image processing engine 136 is capable of forming multiple, coordinated images for display, for example, via the display or monitor 142, to provide various types of depictions. The image processing engine 136 may comprise a separate and distinct module, which may include application-specific integrated circuitry, or may comprise one or more processors coupled with suitable computer-readable program modules, or may comprise a portion of the computer 130 or other computation device.

The MRI system 100 also includes memory devices 150, coupled via the bus 138 to the computer 130 through suitable interfaces. The memory devices 150 include mass data storage capabilities 154 and one or more removable data storage device ports 156. The one or more removable data storage device ports 156 are adapted to detachably couple to a portable data storage device or memory 158, which may include optical, magnetic and/or semiconductor memories and may have read and/or write capabilities, and which may be volatile or non-volatile memory devices or may include a combination of the preceding capabilities.

The MRI system 100 further includes a data acquisition and conditioning module 160 that has data inputs coupled to either the RF receiver coil 110 or the RF body coil and that is coupled by the bus 139 to the one or more computers 130. The data acquisition and conditioning module 160 includes analog to digital conversion circuitry for capturing analog data, either from the RF receiver coil 110 or from the RF body coil, and then converting the data into digital form.

The resulting digital data then may be supplied to the one or more computers 130 for ultimate display via at least one of the displays 142 and for potential storage in the mass storage device 154 and/or data exchange with remote facilities (not shown in FIG. 1). Data acquired from the MRI system 100, through cooperation of the subsystems such as the control 120 and signal processing 136, 160 modules, acting to manipulate magnetic fields within the bore 114 and to collect and process signals from the RF receiver coil 110 or the RF body coil, may be conditioned in any of the data acquisition and conditioning module 160, the one or more computers 130 or signal processing capabilities associated with remote computing resources (not illustrated in FIG. 1) to form images or quantitative or qualitative assessments of internal portions of the patient 112.

Figure 2:
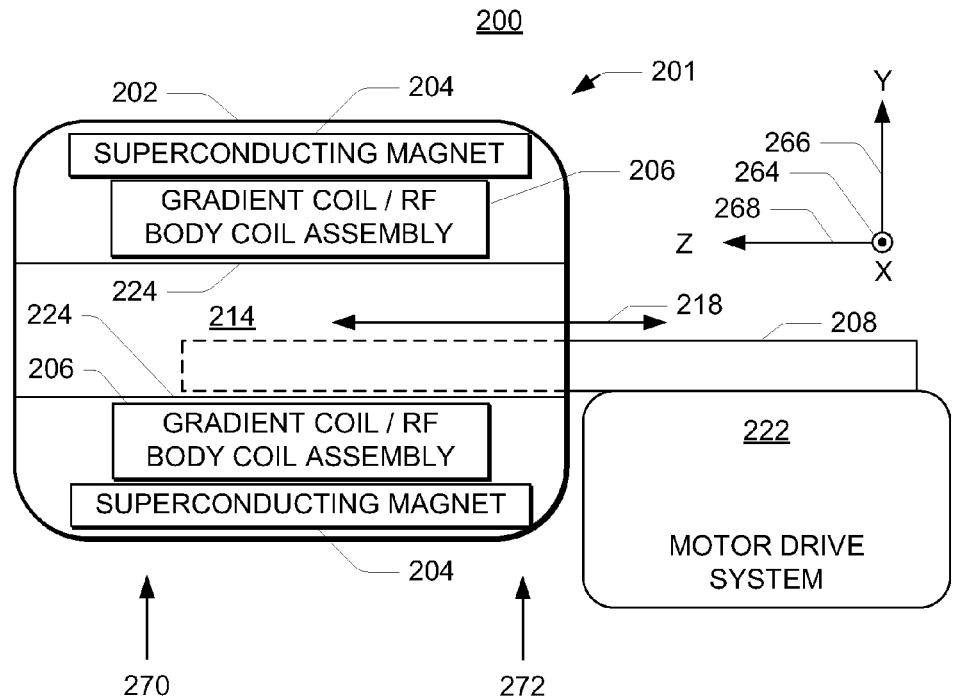
FIG. 2 is a block diagram of a simplified side view of an embodiment of the MRI system of FIG. 1, illustrating elements of a resonance module assembly in accordance with an embodiment.

FIG. 2 is a block diagram of a simplified side view of an embodiment of the MRI system of FIG. 1, illustrating elements of a resonance module assembly in accordance with an embodiment. FIG. 2 is not drawn to scale. The side view 201 of the MRI system 200 includes a cross-sectional view of a resonance module assembly 202, corresponding to the resonance module 102 of FIG. 1. Resonance module assembly 202 includes a superconducting magnet 204 and an integrated gradient coil/RF coil assembly 206.

A patient bore 214 within the resonance module assembly 202 is surrounded by a patient bore tube 224. In one embodiment, the gradient coil/RF coil assembly 206 located adjacent to an outer surface of the patient bore tube 224 and the combination is contained within and circumferentially surrounded by the superconducting magnet 204. It will be appreciated by those having skill in the relevant arts that other mounting embodiments having similar geometries are possible and known. Various other elements, such as coils, cryostat elements, supports, suspension members, end caps, brackets, etc. are omitted from FIG. 2 for clarity. A support system 208, analogous to the test subject support 108 of FIG. 1, is illustrated as being capable of translation along an axis 218 (indicated by a bidirectional arrow in FIG. 2), and which is analogous to the axis 118 illustrated in FIG. 1, via longitudinal locomotion into and out of the patient bore or opening 214 via motion imparted by the motor drive system 222, analogous to the motor drive system 122 of FIG. 1 and under the control thereof.

An exemplary coordinate system is illustrated via an X axis 264, extending out of the plane of FIG. 2 towards the reader, as indicated by a depiction of a circle having a black center (⊙, a "bull's eye" pattern), a Y axis 266 and a Z axis 268 (parallel to longitudinal axes 118 of FIGS. 1 and 218 of FIG. 2). MRI system 200 has a "service end" 270 and a "patient end" 272. The coordinate systems employed in the literature may utilize different nomenclature, however, in general, the Z axis 268 is often taken to extend from the patient end 272 towards the service end 270 of the MRI system 200.

The superconducting magnet 204 includes main coils (not explicitly illustrated) and may also include, for example, shielding coils (not explicitly illustrated) at larger radii than the main coils. The superconductive main coils are designed to create a main magnetic field, $B_0$, of high uniformity within the patient bore 214. The superconducting magnet 204 is enclosed in a cryogenic environment designed to maintain the temperature of the superconducting coils below the appropriate critical temperature so that the coils are in a superconducting state with zero resistance. The gradient coil/RF coil assembly 206 includes a gradient coil assembly that may be used to generate time dependent gradient magnetic pulses that are used to spatially encode points in an imaging volume in a known manner. The gradient coil/RF coil assembly 206 also includes an RF body coil that may be used to apply a radio frequency pulse (or a plurality of pulses) to a test subject (e.g., patient 112 of FIG. 1), and may be used to receive MR information or signals back from the test subject.

Figure 3:
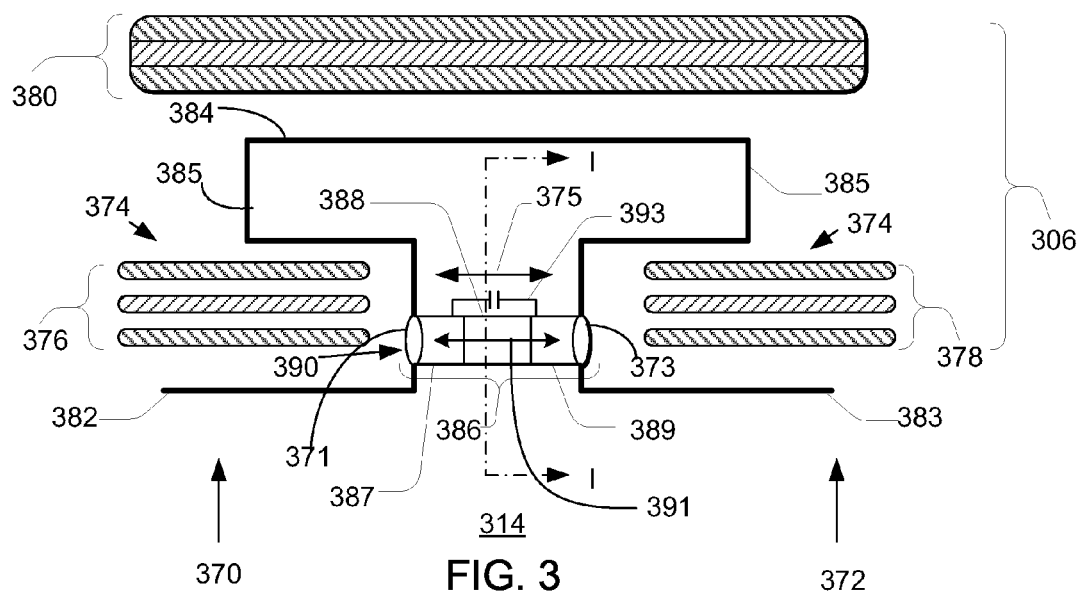
FIG. 3 is a simplified and enlarged longitudinal sectional view illustrating an integrated gradient coil/RF coil assembly in accordance with an embodiment.

The gradient coil/RF coil assembly 206 is an integrated or combined gradient coil/RF coil configuration FIG. 3 is a simplified and enlarged longitudinal sectional view illustrating an integrated gradient coil/RF coil assembly in accordance with an embodiment. In particular, FIG. 3 illustrates an enlarged and more detailed view of the gradient coil/RF coil assembly 206 of FIG. 2, as designated by reference character 306. The gradient coil/RF coil assembly 306 is disposed radially outward of a bore 314. FIG. 3 also illustrates a service end 370 and a patient end 372, corresponding to analogous elements 270 and 272, as illustrated in FIG. 2.

In the embodiment shown in FIG. 3, the gradient coil of the gradient coil/RF body coil assembly 306 is shielded and includes an inner (or main) gradient coil assembly 374 and an outer (or shielding) gradient coil assembly 380. The main gradient coil assembly 374 is split into two sections, a first section 376 and a second section 378, with a gap (or aperture or opening) 375 disposed between the first section 376 and the second section 378 along the length of the main gradient coil assembly 374. In one embodiment, the first section 376 and the second section 378 each form one-half of the main gradient coil assembly 374, with the gap 375 disposed in approximately the middle of the split halves of the main gradient coil assembly 374. Each section 376, 378 of the main gradient coil assembly 374 includes main (or inner) X-, Y-, and Z-gradient coils (represented by elongated regions having alternating hatch marks). The shielding gradient coil assembly 380 includes shielding (or outer) X-, Y- and Z-gradient coils (represented in FIG. 3, and some subsequent FIGs., by alternating hatch marks).

Figure 4:
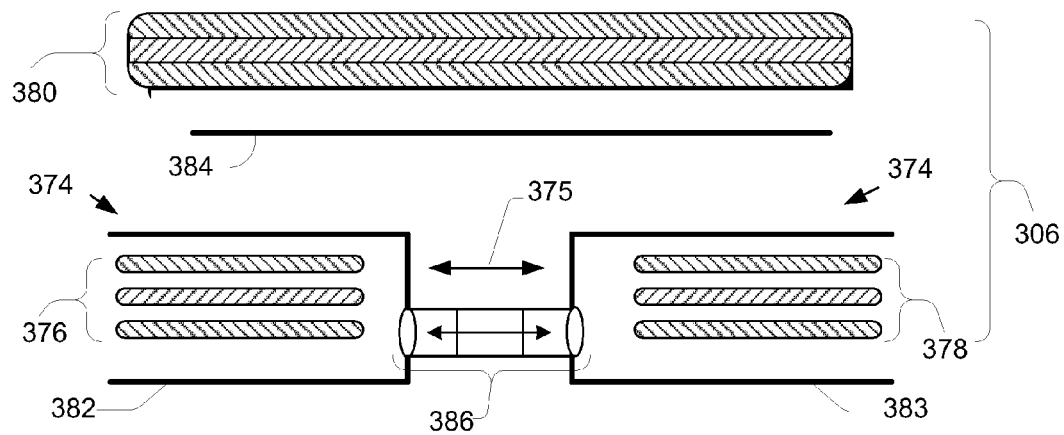
FIG. 4 is a simplified and enlarged longitudinal sectional view illustrating an integrated gradient coil/RF coil assembly in accordance with an alternative embodiment.
Figure 5:
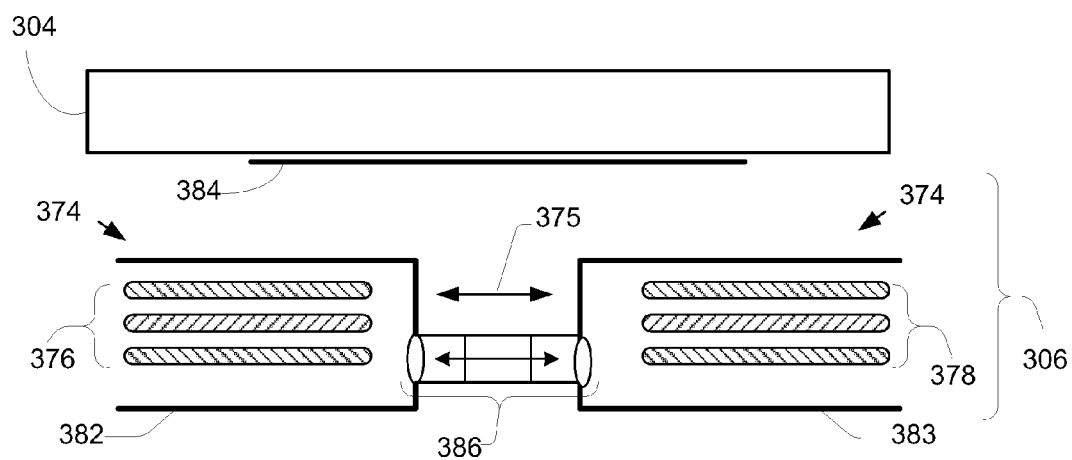
FIG. 5 is a simplified and enlarged longitudinal sectional view illustrating an integrated gradient coil/RF coil assembly in accordance with an alternative embodiment.

A first RF shield 382 and a second RF shield 383 separate the split main gradient coil assembly sections 376 and 378, respectively, from the gap or opening 375. The first RF shield 382 is wrapped or disposed around at least a portion of the first section 376 and the second RF shield 383 is wrapped or disposed around at least a portion of the second section 378. The RF shields 382, 383 typically comprise a conductive material, such as copper foil. In the embodiment shown in FIG. 3, the first RF shield 382 and the second RF shield 383 are connected to a third RF shield 384 positioned on or in proximity to an inner surface of the outer gradient coil assembly 380 using RF shield side walls 385. At least one rung or conduit 386 extends across gap 375 between the first section 376 of the main gradient coil assembly and the second section 378 of the main gradient coil assembly. In an alternative embodiment, shown in FIG. 4, the first section 376 of the main gradient coil assembly 374 is surrounded by a first RF shield 382 and the second section 378 of the main gradient coil assembly 374 is surrounded by a second RF shield 383. A third RF shield 384 is positioned in proximity to or on the inner surface of the outer gradient coil assembly 380, but is not connected to the first RF shield 382 and the second RF shield 383. As in FIG. 3, a rung or conduit 386 extends across the gap or opening 375 between the first section 376 and the second section 378 of the main gradient coil assembly. In another alternative embodiment, the gradient coil of the gradient coil/RF coil assembly 306 is an unshielded gradient coil assembly as shown in FIG. 5 and includes a main gradient coil assembly 374. A first section 376 of the main gradient coil assembly is surrounded by a first RF shield 382 and the second section 378 of the main gradient coil assembly is surrounded by a second RF shield 383. A third RF shield 384 may be attached to an inner surface of the superconducting magnet 304 (e.g., an inner surface of a magnet vessel). As in FIG. 3, a rung or conduit 386 extends across the gap or opening 375 between the first section 376 and the second section 378 of the main gradient coil assembly.

Figure 6:
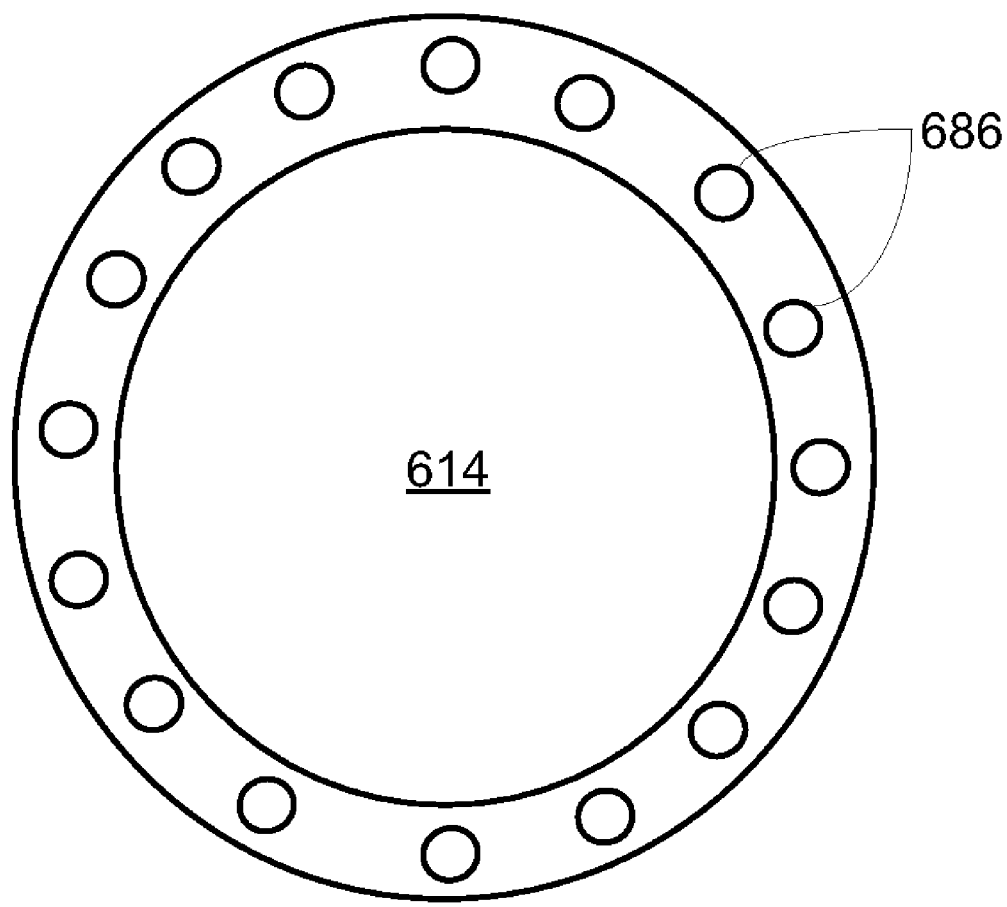
FIG. 6 shows a cross-section along line I-I of FIG. 3 illustrating an exemplary distribution of rungs in accordance with an embodiment.

Returning to FIG. 3, rung or conduit 386 is a hollow, cylindrical rung or tube that may be used for a plurality of functions including, but not limited to, an RF antenna element, a conduit for hydraulic connections (e.g., a cooling line or tube) between the two sections 376, 378 of the main gradient coil assembly 374 and/or a conduit for electrical connections (e.g., electrical conductors or leads) between the two sections 376, 378 of the main gradient coil assembly 374. A first end 371 of conduit 386 is connected to an opening in the first RF shield 382 (e.g., the first end 371 may be soldered or welded to the sides of the opening in the first RF shield 382) and a second end 373 of conduit 386 is connected to an opening in the second RF shield 383 (e.g., the second end 373 may be soldered or welded to the sides of the opening in the second RF shield 383). In an embodiment, conduit 386 forms a rung of an RF coil, such as a birdcage type RF coil, having a plurality of rungs distributed about the bore 314 in the gap 375 between the two sections 376, 378 of the main gradient coil assembly 374. FIG. 6 shows a cross-section along line I-I of FIG. 3 illustrating an exemplary distribution of rungs in accordance with an embodiment. In FIG. 6, a plurality of rungs 686 are distributed about the bore 614 in the gap or opening between the two sections of the main gradient coil assembly. In one embodiment, the rungs are distributed uniformly about the bore 614. In FIG. 6, the rungs are represented as sixteen circles distributed about the bore. In one embodiment, thirty-two rungs may be utilized. It will be appreciated by those of ordinary skill in the relevant arts that larger or smaller numbers of rungs may be employed, to collectively provide a number of rungs suitable to a particular system design, in conformance with appropriate RF design criteria and system performance considerations and specifications. At least one of the rungs 686 of the coil is a conduit as shown in FIG. 3 and as described further herein with respect to FIGS. 7-11.

Figure 7:
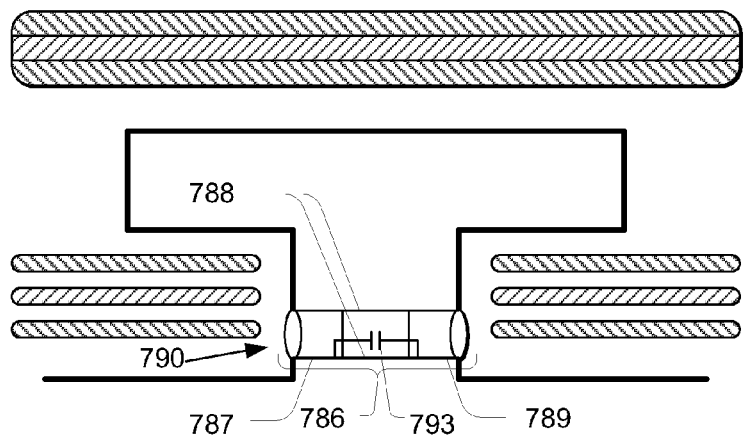
FIG. 7 is a simplified and enlarged longitudinal sectional view illustrating an integrated gradient coil/RF coil assembly in accordance with an alternative embodiment

Referring again to FIG. 3, an embodiment is shown where conduit 386 forms an antenna element or rung of the RF coil. Accordingly, conduit 386 comprises multiple segments, a first segment 387, a second (or intermediate or middle) segment 388 and a third segment 389. Conduit 386 includes a hollow core or channel 390 extending through the segments 387, 388 and 389 as shown by bidirectional arrow 391. To function as an antenna element, the first segment 387 and the third segment 389 are formed from a conductive material (e.g., copper) and a capacitor 393 is connected to the first 387 and third 389 segments to bridge current between the first 387 and third 389 segments. The second (or middle) segment 388 is formed from an insulating material. In an alternative embodiment, where the conduit 386 is not used to carry a hydraulic or electrical connection, the capacitor may be housed inside the conduit 386 in the hollow core 390 as shown in FIG. 7. FIG. 7 shows a simplified and enlarged longitudinal sectional view illustrating an integrated gradient coil/RF coil assembly in accordance with an alternative embodiment. A capacitor 793 is positioned inside the rung 786 (e.g., in channel 790) and connects the first segment 787 and the third segment 789 of the rung 786, bridging the insulating second segment 788. Returning to FIG. 3, in another embodiment, conduit 386 is used as a dedicated bridging element which does not serve as an antenna element, but provides hydraulic and/or lead connections only and all of the segments 387, 388 and 389 of conduit 386 are made from a non-conductive material (e.g., a plastic pipe).

Figure 8:
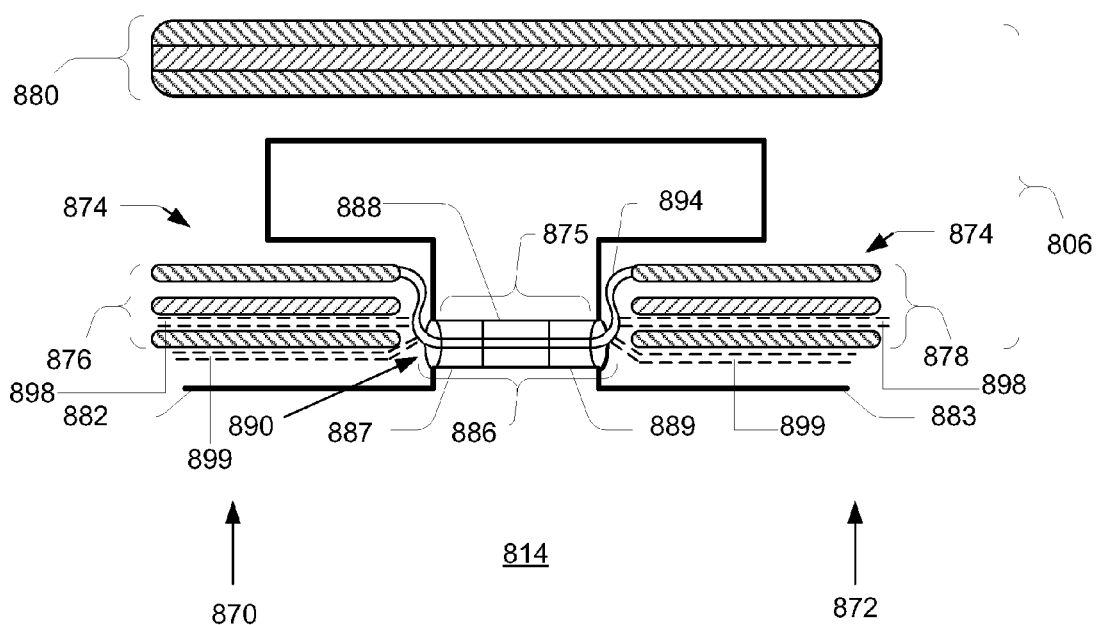
FIG. 8 is a simplified and enlarged longitudinal sectional view illustrating an integrated gradient coil/RF coil assembly with hydraulic or electrical connections in accordance with an embodiment

As mentioned above, conduit 386 may also be used for hydraulic or electrical connections. FIG. 8 is a simplified and enlarged longitudinal sectional view illustrating an integrated gradient coil/RF coil assembly with hydraulic or electrical connections in accordance with embodiments of the invention. Gradient coil/RF coil assembly 806 is disposed radially outward of a bore 814. Arrows denote a service end 870 and a patient end 872 of the gradient coil/RF coil assembly 806. A split main gradient coil assembly 874 includes a first section 876 and a second section 878, separated by a gap, aperture or opening 875. A shielding gradient coil assembly 880 is shown. A first RF shield 882 and a second RF shield 883 separate the split main gradient coil sections 876, 878, respectively, from the gap or opening 875.

A conduit 886, comprising a first segment 887, a second segment 888 and a third segment 889, extends between the two sections 876, 878 of the split main gradient coil assembly 874 and forms a rung bridging the opening 875. As discussed above with respect to FIG. 3, the conduit 886 may form an antenna element of an RF coil. The conduit 886 includes a hollow core or channel 890 (analogous to hollow core or channel 390 as shown in FIG. 3) extending through the segments 887, 888 and 889. A hydraulic (e.g., a coolant line or tube) or electrical (e.g., an electrical conductor or lead) connection 894 is disposed within or housed inside the hollow core or channel 890. Accordingly, the hydraulic or electrical connection 894 passes through the conduit 886. In FIG. 8, the connection 894 is shown connected to individual coils in each of the sections 876, 878 of the main gradient coil assembly 874. In alternative embodiments, the ends of connection 894 may be directed along alternative paths as required by the hydraulic or electrical connections for a particular system configuration. For example, the ends of connection 894 may pass between individual coils of the main gradient coil assembly 874 or along the inner radius of the main gradient coil assembly 874 as shown by dashed lines 898 and 899, respectively.

Figure 9:
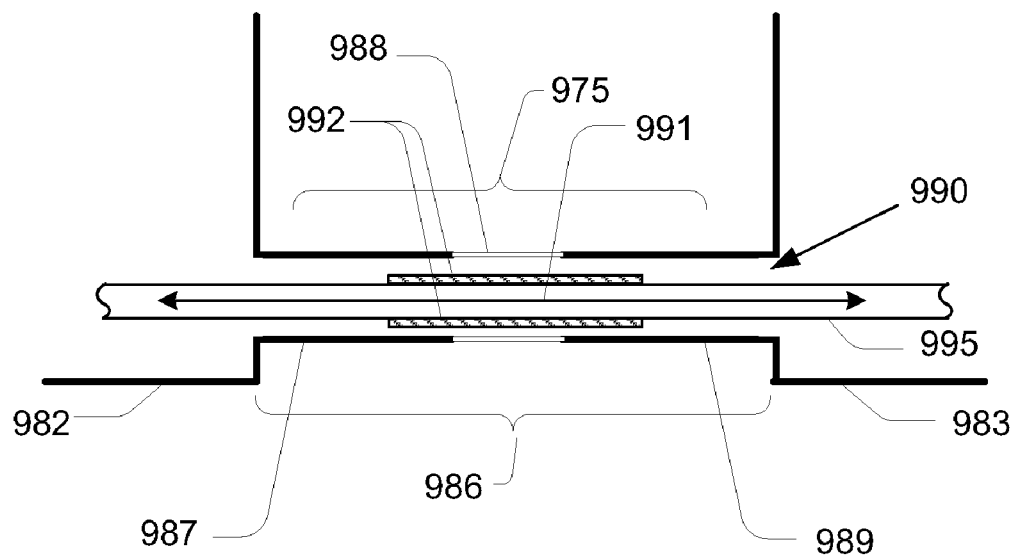
FIG. 9 is an enlarged and simplified longitudinal sectional view, analogous to a sub-portion of the elements shown in the view of FIG. 8, with a hydraulic connection in accordance with an embodiment.

In one embodiment, connection 894 is a hydraulic connection (e.g., a coolant line or tube) that couples fluid coolant between the first 876 and second 878 sections of the main gradient coil assembly 874. FIG. 9 is an enlarged and simplified longitudinal sectional view, analogous to a sub-portion of the elements shown in the view of FIG. 8, with a hydraulic connection in accordance with an embodiment. A gap or opening 975 extends between the first RF shield 982 and the second RF shield 983. A conduit 986 bridges the opening 975 and includes a first segment 987, and second segment 988 and a third segment 989. As discussed above with respect to FIG. 3, if conduit 986 is also utilized as an antenna element, the first segment 987 and third segment 989 are formed of conductive material, the second (insulating) segment 988 is formed from an insulating (non-conductive) material and a capacitor 393 (shown in FIG. 3) is connected to the first 987 and third 989 segments. Alternatively, if conduit 986 is used for providing hydraulic connections only, all three segments 987, 988 and 989 may be made from non-conductive material.

A coolant line or tube 995 is disposed within and extends through a hollow core or channel 990 of the conduit 986 to allow coolant to circulate between first and second sections (e.g., sections 876, 878 shown in FIG. 8) of the split main gradient coil assembly 874 (shown in FIG. 8) as indicated by bidirectional arrow 991. When the coolant employed is a fluid that includes hydrogen nuclei, e.g., is water-based, or includes other materials whose physical properties may interfere with imaging, an RF shield 992 may surround and enclose the coolant line or tube 995. In one embodiment, the RF shield 992 may be contained within, or extend through, the second segment 988 that comprises non-conductive material and may extend into the conductive conduit segments 987, 989 disposed at either end of the nonconductive segment 988. In an embodiment where all segments 987, 988, 989 are comprised of non-conductive material, the RF shield 992 may extend through the entire conduit 986.

Figure 10:
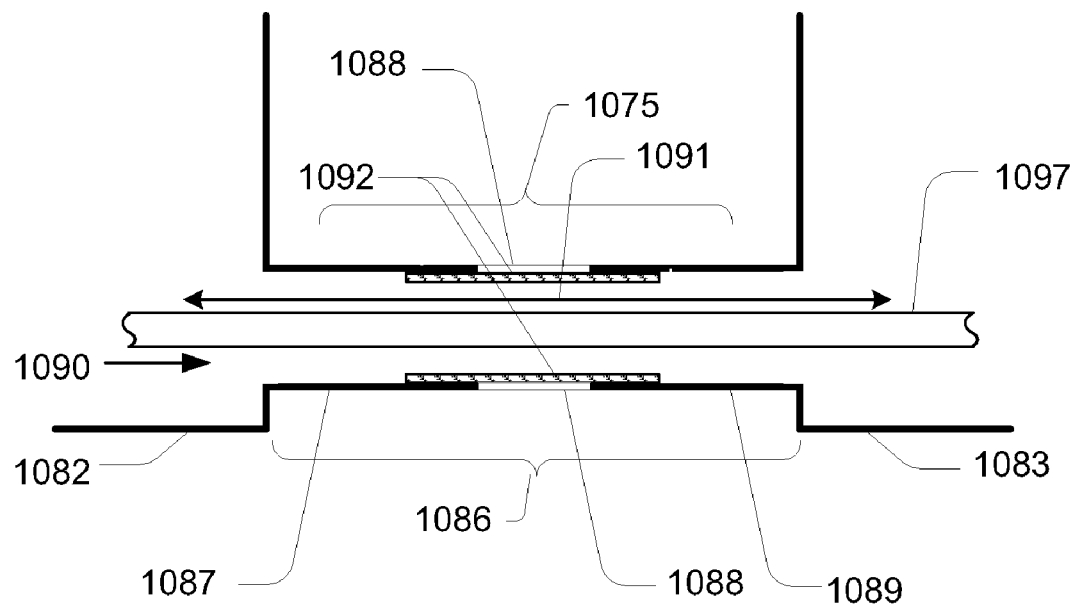
FIG. 10 is an enlarged and simplified longitudinal sectional view, analogous to a sub-portion of the elements shown in the view of FIG. 8, with an electrical connection in accordance with an embodiment.

Returning to FIG. 8, in another embodiment, connection 894 is an electrical connection (e.g., an electrical conductor or lead) that electrically couples the first 876 and second 878 sections of the main gradient coil assembly 874. For example, an electrical lead may extend through the hollow channel 890 of conduit 886 and electrically couple corresponding individual coils (e.g., Z coils) of the first 876 and second 878 sections of the split main gradient coil assembly 874. FIG. 10 is an enlarged and simplified longitudinal sectional view, analogous to a sub-portion of the elements shown in the view of FIG. 8, with an electrical connection in accordance with an embodiment. A gap or opening 1075 extends between the first RF shield 1082 and the second RF shield 1083. A conduit 1086 bridges the opening 1075 and includes a first segment 1087, a second segment 1088 and a third segment 1089. As discussed above with respect to FIG. 3, if conduit 1086 is also utilized as an antenna element, the first segment 1087 and third segment 1089 are formed of conductive material, the second (insulating) segment 1088 is formed from an insulating (non-conductive material) and a capacitor 393 (shown in FIG. 3) is connected to the first 1087 and third 1089 segments. Alternatively, if conduit 1086 is used for providing electrical connections only, all three segments 1087, 1088 and 1089 may be made from non-conductive material.

An electrical conductor or lead 1097 is disposed within and extends through a hollow core or channel 1090 of the conduit 1086 to electrically couple the first and second sections (e.g., sections 876, 878 shown in FIG. 8) of the split main gradient coil assembly 874 (shown in FIG. 8) as indicated by bidirectional arrow 1091. An RF shield 1092 may be disposed within the conduit 1086 and surround channel 1090 and conductor 1097. The RF shield 1092 may be contained within and extend through the second segment 1088 that comprises non-conductive material and may extend into the conductive conduit segments 1087, 1089 disposed at either end of the non-conductive segment 988. In an embodiment where all segments 1087, 1088, 1089 are comprised of non-conductive material, the RF shield 1092 may extend through the entire conduit 1086.

The embodiments described hereinabove may be combined in various ways. For example, in an embodiment with a plurality of rungs or conduits (e.g., an RF coil configuration as shown in FIG. 6), a first conduit may be utilized as an antenna element (e.g., with conductive and non-conductive segments) only, namely, without including a coolant line or electrical lead. A second conduit may be utilized as an antenna element and include a coolant line. A third conduit may be utilized as an antenna element and include an electrical lead. A fourth conduit may include a hydraulic or electrical connection only and not be configured as an antenna element. In one embodiment, conduits capable of being used as an antenna element and to conduct coolant are interleaved with conduits capable of being used as an antenna element and to provide current-carrying electrical connections. In other embodiments, some of the rungs are used as conduits for hydraulic or electrical connections and the remaining rungs are used only as antenna elements. For example, six of the rungs 686 (shown in FIG. 6) may be used as antenna elements and for electrical connections, two of the rungs 686 may be used as antenna elements and for coolant connections and the remaining eight rungs 686 may be used as antenna elements only and carry no hydraulic or electrical connections.

Figure 11:
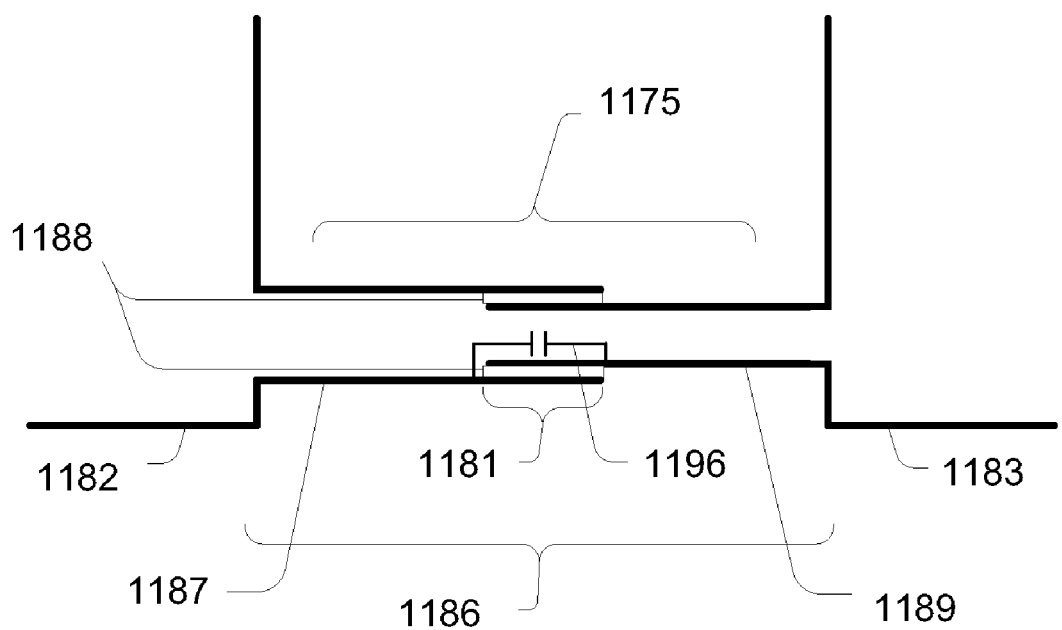
FIG. 11 is an enlarged and simplified longitudinal sectional view, illustrating an embodiment.

Returning to FIG. 3, as mentioned, capacitance may be provided by a capacitor 393 connected to the first segment 387 and the third segment 389 of the conduit 386. FIG. 11 illustrates an alternative way in which the capacitance 393, shown symbolically using the schematic representation of a capacitor in FIG. 3, may be realized within the exterior of the conduit or rung 386.

In FIG. 11, a gap or opening 1175 extends between the first RF shield 1182 and the second RF shield 1183. A conduit 1186 bridges the opening 1175 and includes a first segment 1187 and a third segment 1189 that comprise conductive material. A non-conductive second segment 1188 couples the first 1187 and second 1189 segments. The ends of the first segment 1187 and the third segment 1189 that are near the middle of the gap 1175 are arranged so that one (shown as a part of the third segment 1189 in this example) fits around the interior of the insulating second segment 1188 and the other (shown as part of the first segment 1187, in this example) fits around the exterior of the insulating second segment 1188. This results in a degree of overlap 1181 that acts as a capacitance (represented symbolically in FIG. 11 as capacitor 1196) that electrically couples conductive segments 1187, 1189 of the conduit 1186.

Consequently, the novel concepts disclosed herein facilitate flexibility in design and construction of MRI systems 100. In some embodiments, not all of the rungs or conduits include aspects of electrical or mechanical functionality in addition to an antenna function. More specifically, in one embodiment, one or more of the rungs 386, 686, 886 depicted in FIGS. 3, 6, and 8 are intended to be multifunctional, and thus may form conduits 886, 986 suitable for coupling coolant between sections of the MRI system 100, as depicted above with specific reference to respective FIGS. 8 and 9. In one embodiment, one or more of the rungs 386, 686, 886 of FIGS. 3, 6 and 8 may form conduits 886, 1086 suitable for coupling electrical conductors between sections of the MRI system 100, as discussed above with particular reference to the illustrations of FIGS. 8 and 10, respectively. Put another way, some or all of the rungs associated with the MRI system function as antenna elements or rungs. However, some of the rungs may be simply conduits, that is, not function as antenna elements, and/or one or more of the rungs may include additional functionality, in conformance with the concepts contained herein. Exemplary implementations of these disclosed concepts are examined supra with reference to one or more of FIGS. 3 through 11.

Although specific embodiments have been illustrated and described herein, it will be appreciated by those of ordinary skill in the art that any arrangement which is calculated to achieve the same purpose may be substituted for the specific embodiments shown. This disclosure is intended to cover any adaptations or variations. For example, although described in procedural terms, one of ordinary skill in the art will appreciate that implementations can be made in a procedural design environment or any other design environment that provides the required relationships.

In particular, one of skill in the art will readily appreciate that the names or labels of the processes and apparatus are not intended to limit embodiments. Furthermore, additional processes and apparatus can be added to the components, functions can be rearranged among the components, and new components to correspond to future enhancements and physical devices used in embodiments can be introduced without departing from the scope of embodiments.

What is claimed is:

1. A coil assembly for a magnetic resonance imaging (MRI) system, the coil assembly comprising:
    a main gradient coil assembly comprising a first section positioned at a first end of the MRI system distal to a patient support system and a second section positioned at a second end of the MRI system proximate to the patient support system;
    a first RF shield disposed around at least a portion of the first section of the main gradient coil assembly;
    a second RF shield disposed around at least a portion of the second section of the main gradient coil assembly;
    an aperture extending between the first section and the second section of the main gradient coil assembly;
    a conduit extending across the aperture and comprising a first end coupled to the first RF shield and a second end coupled to the second RF shield; and
    a hydraulic connection disposed within and extending through the conduit.

2. A coil assembly according to claim 1, wherein the conduit is an antenna element.

3. A coil assembly according to claim 1, wherein the hydraulic connection is a coolant line.

4. A coil assembly according to claim 2, wherein the conduit further comprises:
    a first segment comprising conductive material and connected to the first RF shield;
    a second segment comprising non-conductive material and connected to the first segment; and
    a third segment comprising conductive material and connected to the second segment and the second RF shield.

5. A coil assembly according to claim 1, wherein the conduit comprises a non-conducting material.

6. A coil assembly according to claim 2, wherein the first RF shield, the second RF shield and the conduit form at least a portion of an RF coil.

7. A coil assembly according to claim 4, wherein the conduit further comprises a capacitor connected to the first segment and the third segment.

8. A coil assembly according to claim 1, wherein the hydraulic connection comprises a first end coupled to the first section of the main gradient coil assembly and a second end coupled to the second section of the main gradient coil assembly.

9. A coil assembly for a magnetic resonance imaging (MRI) system, the coil assembly comprising:
    a main gradient coil assembly comprising a first section positioned at a first end of the MRI system distal to a patient support system and a second section positioned at a second end of the MRI system proximate to the patient support system;
    a first RF shield disposed around at least a portion of the first section of the main gradient coil assembly;
    a second RF shield disposed around at least a portion of the second section of the main gradient coil assembly;
    an aperture extending between the first section and the second section of the main gradient coil assembly;
    a conduit extending across the aperture and comprising a first end coupled to the first RF shield and a second end coupled to the second RF shield; and
    an electrical connection disposed within and extending through the conduit.

10. A coil assembly according to claim 9, wherein the conduit is an antenna element.

11. A coil assembly according to claim 9, wherein the conduit further comprises:
    a first segment comprising conductive material and connected to the first RF shield;
    a second segment comprising non-conductive material and connected to the first segment; and
    a third segment comprising conductive material and connected to the second segment and the second RF shield.

12. A coil assembly according to claim 9, wherein the first RF shield, the second RF shield and the conduit form at least a portion of an RF coil.

13. A coil assembly according to claim 12, wherein the conduit further comprises a capacitor connected to the first segment and the third segment.

14. A coil assembly according to claim 9, wherein the electrical connection is an electrical lead.

15. A coil assembly according to claim 9, wherein the conduit comprises a non-conducting material.

16. A coil assembly according to claim 9, wherein the electrical connection comprises a first end coupled to the first section of the main gradient coil assembly and a second end coupled to the second section of the main gradient coil assembly.

* * * * *